United States Patent [19]
Schneider et al.

[11] Patent Number: 5,451,940
[45] Date of Patent: Sep. 19, 1995

[54] CAPACITIVE SENSOR SIGNAL PROCESSING ARRANGEMENT USING SWITCH CAPACITOR STRUCTURES

[75] Inventors: Georg Schneider, Schopfheim-Langenau; Richard Wagner, Maulburg, both of Germany

[73] Assignee: Endress u. Hauser GmbH u. Co., Germany

[21] Appl. No.: 887,465

[22] Filed: May 22, 1992

Related U.S. Application Data

[63] Continuation-in-part of Ser. No. 631,383, Dec. 20, 1990, abandoned.

[30] Foreign Application Priority Data

Dec. 20, 1989 [DE] Germany ............... 39 42 159.7

[51] Int. Cl.[6] ............................................. G08C 19/10
[52] U.S. Cl. ........................... 340/870.37; 73/724; 324/661; 257/415
[58] Field of Search ............ 340/870.37; 324/678, 324/677, 679, 686, 607, 660, 661; 370/112; 73/718, 724; 257/415, 417, 418, 419, 420; 381/174

[56] References Cited

U.S. PATENT DOCUMENTS

| | | | |
|---|---|---|---|
| 3,193,803 | 7/1965 | Hoffman . | |
| 3,886,447 | 3/1975 | Tanaka . | |
| 4,039,940 | 8/1977 | Butler et al. . | |
| 4,283,676 | 9/1981 | Shaw . | |
| 4,862,382 | 8/1989 | Schneider et al. | 364/481 |
| 5,210,501 | 5/1993 | Schneider et al. | 324/720 |
| 5,257,210 | 10/1993 | Schneider et al. | 364/553 |

FOREIGN PATENT DOCUMENTS 2072856 10/1981 United Kingdom .

OTHER PUBLICATIONS

Watanabe et al., "A Switched–Capacitor Interface for Intelligent Capacitive Transducers", IEEE Transactions on Instrumentation and Measurement, vol. IM–35, No. 4, pp. 472–476, Dec. 1986.
Matsumoto et al., "A Switched–Capacitor Digital Capacitive Meter", IEEE Transactions on Instrumentation and Measurement, vol. IM–35, No. 4, pp. 555–559, Dec. 1986.
Kondo et al., "A Switched–Capacitor Interface for Capacitive Sensors with Wide Dynamic Range", IEEE Transactions on Instrumentation and Measurement, vol. 38, No. 3, pp. 736–739, Jun. 1989.
Matsumoto et al., "A Switched–Capacitor Charge Balancing Analog-to-Digital Converter and Its Application to Capacitance Measurement", IEEE Transactions on Instrumentation and Measurement, vol. IM–36, No. 4, pp. 873–878, Dec. 1987.
J. Knapp, "Einfacher Anpasser fuer kapazitive Sensoren", 8008 Technisches Messen 54, Heft 3, pp. 111–115, 1987.

*Primary Examiner*—Brent Swarthout
*Assistant Examiner*—Daniel J. Wu
*Attorney, Agent, or Firm*—Barnes & Thornburg

[57] ABSTRACT

The arrangement serves for the processing of sensor signals which are furnished by a capacitive sensor which includes a measuring capacitor having a measuring capacitance influenceable by a physical measured quantity to be determined and at least one reference capacitor having a reference capacitance influenceable in another manner and furnishing a measuring effect dependent on the measuring capacitance and the reference capacitance. The arrangement comprises a signal processing circuit which operates by the principle of quantized charge transport by means of switch-capacitor structures and charge balancing at least in time average and which receives the sensor signals representing the measuring effect and furnishes an output signal corresponding to the measuring effect. The first electrodes of the capacitors of the sensor are at a fixed potential and their second electrodes are connectable for performing the charge transport to the first input of an input operational amplifier, the second input of which lies at a reference potential. The reverse charging of the capacitors of the sensor necessary for forming the transported charge packets is effected by switching over the reference potential of the input operational amplifier. This permits a one-sided fixed binding of the sensor capacitors to any desired potential.

14 Claims, 5 Drawing Sheets

CAPACITIVE SENSOR SIGNAL PROCESSING ARRANGEMENT USING SWITCH CAPACITOR STRUCTURES

This application is a continuation-in-part of application Ser. No. 07/631,383 filed Dec. 20, 1990, now abandoned.

FIELD OF THE INVENTION

The invention concerns an arrangement for processing sensor signals furnished by a capacitive sensor.

BACKGROUND OF THE INVENTION

In the periodical "IEEE Transactions on Instrumentation and Measurement", Dec. 1987, pp. 873 to 878, an arrangement for processing sensor signals furnished by a capacitive sensor is described which includes a measuring capacitance influenceable by a physical measured quantity to be determined and at least one reference capacitor having a reference capacitance influenceable in another manner and furnishing a measuring effect dependent on said measuring capacitance and said reference capacitance, comprising a signal processing circuit which operates by the principle of quantized charge transport by means of switch-capacitor structures and charge balancing at least in time average and which receives said sensor signals representing said measuring effect and furnishes an output signal corresponding to said measuring effect.

Signal processing by the quantized charge transport principle by means of switch-capacitor structures and charge balancing has the advantages that offset voltages of the operational amplifiers used have no influence on the output signal, that the circuits are completely integrable in CMOS technology and that no accurate long-term reference voltage is necessary. Furthermore, from the clock pulses with which the switch-capacitor structures are controlled for performing the charge transports two clock signals can be derived, the frequency or pulse ratio of which is directly proportional to the measuring effect so that the measurement result is available in digital form.

In this pre-described circuit, one electrode of each of the capacitors of the sensor or an electrode common to them is connected by the signal line leading to the signal processing circuit to an input of an operational amplifier, the other input of which lies at a fixed reference potential, for example ground potential. By periodically actuated switches the voltages which are necessary for reverse charging in order to produce the charge packets to be transported, are applied to the other electrodes of the sensor capacitors.

A disadvantage of this pre-described arrangement is that all said electrodes are active. The function can, therefore, be disturbed if charges are coupled onto the electrodes connected to the signal line by external electric fields. Shieldings necessary to suppress such charge couplings restrict the construction and use possibilities and consequently cannot always be applied.

An object of the invention is to provide an arrangement which whilst retaining the advantages of the signal processing by the principle of quantized charge transport by means of switch-capacitor structures and charge balancing permits a one-sided fixed connection of said capacitors to any desired potential.

SUMMARY OF THE INVENTION

According to the invention, there is provided an arrangement for processing sensor signals furnished by a capacitive sensor which includes a measuring capacitance influenceable by a physical measured quantity to be determined and at least one reference capacitor having a reference capacitance influenceable in another manner than by said physical quantity and which furnishes a measuring effect dependent on said measuring capacitance and said reference capacitance, comprising a signal processing circuit which operates by the principle of quantized charge transport by means of switch-capacitor structures and charge balancing at least in time average and which receives said sensor signals representing said measuring effect and furnishes an output signal corresponding to said measuring effect, wherein first electrodes of said capacitors of said sensor lie at a fixed potential and second electrodes of them for performing said charge transport are temporarily connectable to a first input of an input operational amplifier, a second input of which lies at a reference potential, and wherein a reverse charging of said capacitors of said sensor necessary for forming transported charge packets is effected by switching over said reference potential of said input operational amplifier between different voltage levels.

In the arrangement according to the invention use is made of the fact that the two inputs of an operational amplifier, except for the offset voltage, lie virtually at the same potential. By switching over the reference potential of the input operational amplifies the potential of the respective capacitor electrode connected to the other input is therefore changed in the same manner. In this way the voltage changes necessary for reverse charging of the sensor capacitors can be executed so that only said electrodes are active. In contrast, the other electrodes, which are always inactive, can be applied to any desired potential which may be for example the housing potential of a corresponding sensor. The only condition for this potential is that it must be stable in the short-time range relatively to the supply signal used for the signal processing.

Advantageous embodiments of further developments of the invention are characterized by the subclaims.

BRIEF DESCRIPTION OF THE DRAWINGS

Further features and advantages of the invention will be apparent from the following description of examples of embodiment which are illustrated in the Figures of the drawing.

DETAILED DESCRIPTION OF THE DRAWINGS

Figure 1:
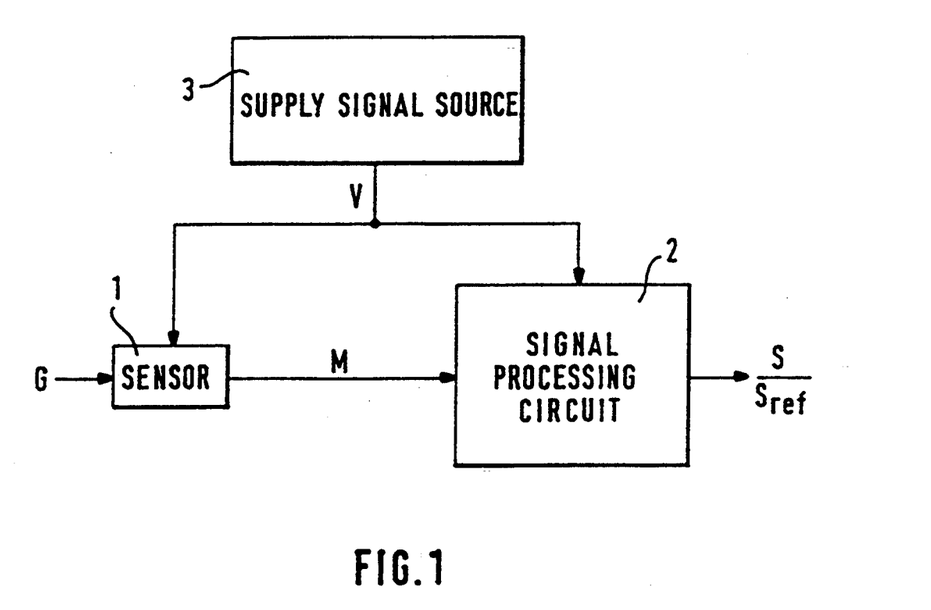
FIG. 1 shows a fundamental scheme for explaining the problem underlying the invention.

To improve understanding, in FIG. 1 the principle of the processing of sensor signals on which the invention is based is shown. FIG. 1 shows a capacitive sensor 1 with the aid of which a physical quantity G is to be measured and a signal processing circuit 2 connected to the sensor 1. The sensor 1 contains a measuring capacitor the capacity of which is variable in dependence upon the physical quantity to be measured. A supply signal source 3 furnishes to the sensor 1 a supply signal V which makes it possible to convert the change of the measuring capacitance to an electrical sensor signal which is supplied to the signal processing circuit 2 and expresses the measuring effect M representing the relationship of the physical quantity G to be measured and the measuring capacitance. The signal processing circuit 2 converts the sensor signal to an output signal S of the desired form which is preferably related to a reference signal $S_{ref}$. Depending on the construction of the signal processing circuit 2, the output signal S may for example be an analog signal, a digital signal or a frequency.

Figure 2:
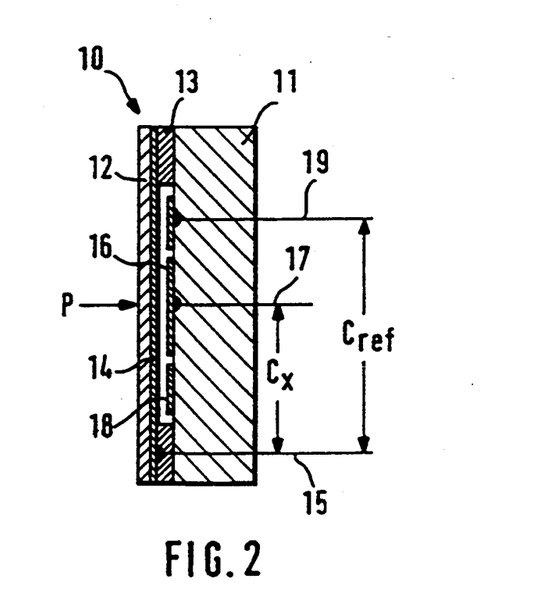
FIG. 2 shows a sectional view of a capacitive sensor.

If it is assumed for example that the physical quantity G to be measured is a pressure) the capacitive pressure sensor 10 illustrated in sectional view in FIG. 2 may be used for the sensor 1. The pressure sensor 10 has a base body 11 and a diaphragm 12 which are connected together at the periphery by a spacer ring 13. The face of the diaphragm 12 facing the base body 11 is provided with a metallization 14 which is connected to a connection conductor 15 led through the spacer ring 13 and the base body 11. The face of the base body 11 facing the diaphragm 12 carries a central circular metallization 18 which is connected to a connection conductor 17 led through the base body 11 and an annular metallization 18 surrounding the metallization 16 and connected to a connection or terminal conductor 19 led through the base body 11.

When a pressure P acts on the outer surface of the diaphragm 12 the latter is deformed so that the distance between the center region of the metallization 14 and the opposite central metallization 16 varies in dependence upon said pressure. The two metallizations 14 and 16 therefore form the electrodes of a measuring capacitor having a capacitance $C_x$ which depends on the pressure P and can be measured between the connection conductors 15 and 17. In contrast, the distance between the edge region of the metallization 14 and the opposite annular electrode 18 remains substantially unchanged during the pressure-dependent deformation of the diaphragm 12 because said distance is fixed by the spacer ring 13. The two metallizations 14 and 18 therefore form the electrode of a reference capacitor having a capacitance $C_{ref}$ which is independent of the pressure P and can be measured between the connection conductors 15 and 19.

The measuring effect M dependent on the pressure and used in the signal processing circuit 2 for generating the output signal $S/S_{ref}$ is therefore in such a capacitive pressure sensor the change of the measuring capacitance $C_x$ relatively to the reference capacitance $C_{ref}$. Depending on the particular use, the measuring effect can be differently represented. For example, the measuring effect $M_1$ can correspond to the capacitance ratio $C_x/C_{ref}$ between the measuring capacitance and the reference capacitance but preferably the capacitance ratio $(C_x-C_{ref})/C_{ref}$ is used because by forming the difference larger relative changes are obtained. A further possibility would be the capacitance ratio $(C_x-C_{ref})/C_x$. Of course, the pressure-dependent measuring capacitance $C_x$ may be used as measuring effect on its own but the quotient formation has the advantage that the measuring effect remains largely unaffected by disturbing influences acting in the same manner on the two capacitances $C_x$ and $C_{ref}$.

Figure 3:
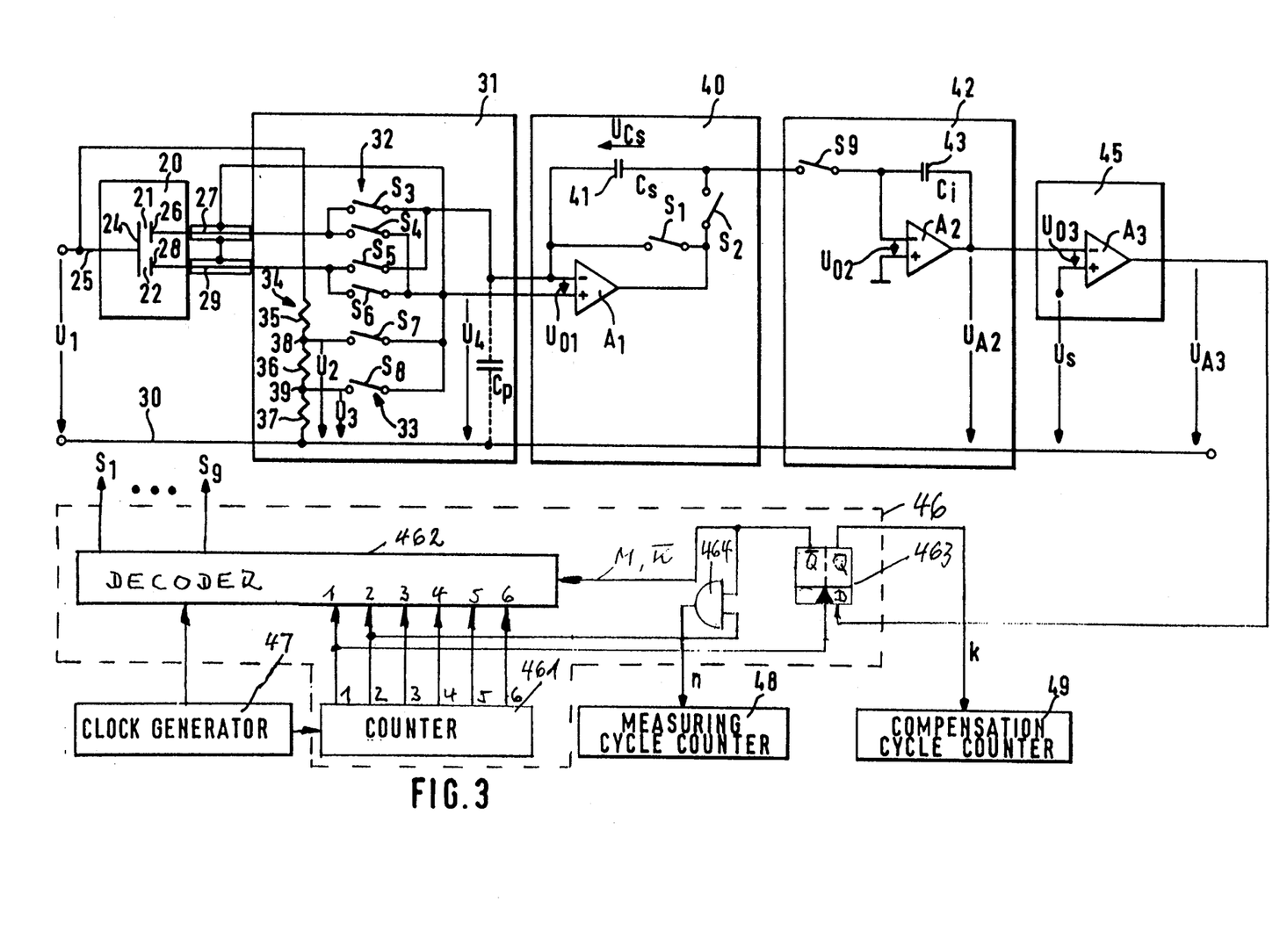
FIG. 3 shows the circuit diagram of a first embodiment of a signal processing circuit working with quantized charge transport by means of switch-capacitor structures and charge balancing and furnishing a frequency as output signal.

FIG. 3 shows an example embodiment of the signal processing circuit of FIG. 1 for the signal processing of the sensor signal furnished by a capacitive sensor 20. The sensor 20 includes a measuring capacitor 21 of capacitance $C_x$ and a reference capacitor 22 of capacitance $C_{ref}$. An electrode 24 is common to the measuring capacitor 21 and the reference capacitor 22. The measuring capacitor 21 is formed by an electrode 26 cooperating with the common electrode 24 and the reference capacitor 22 is formed by an electrode 28 cooperating with the common electrode 24. The capacitive sensor 20 may for example have the structure illustrated in FIG. 2, the electrodes 24, 26, 28 of FIG. 3 then corresponding to the metallizations 14, 16 and 18 respectively of FIG. 2. The measuring effect H of interest is the capacitance ratio $(C_x-C_{ref})/C_{ref}$.

The common electrode 24 is connected via its connection conductor 25, corresponding to the connection conductor 15 of FIG. 2, to a fixed potential which may for example be the housing potential of the sensor 20. The sensor 20 is thus potential-bound on one side. In FIG. 3 the potential at the connection conductor 25 differs by a fixed voltage $U_1$ from the potential of a reference conductor 30; the voltage $U_1$ corresponds to the supply signal V of FIG. 1.

The electrodes 26, 28 are connected via shielded signal lines 27, 29 corresponding to the connection conductors 17 and 19 of FIG. 2 to a function block 31 of the signal processing circuit. The function block 31 contains two switch groups 32 and 33. The function block further includes a voltage divider 34 having three series-connected resistors 35, 36, 37 to which the voltage $U_1$ existing between the connection conductor 25 and the reference conductor 30 is applied. The voltage divider 34 has a first tap 38 between the resistors 35 and 36 and a second tap 39 between the resistors 36 and 37. When the voltage $U_1$ is present at the voltage divider 34 the voltage $U_2$ is present between the tap 38 and the reference conductor 30 and the voltage $U_3$ between the tap 39 and the reference conductor 30.

The function block 31 is followed by a buffer 40 including an operational amplifier $A_1$, a storage capacitor 41 of capacitance $C_s$ and two switches $S_1$ and $S_2$. When the switch $S_1$ is closed, it connects the output of the operational amplifier $A_1$ to the inverting input thereof. When the switch $S_2$ is closed, it connects the output of the operational amplifier $A_1$ to the one electrode of the storage capacitor 41, the other electrode of which is connected to the inverting input of the operational amplifier $A_1$ so that the storage capacitor 41 then lies in the feedback circuit of the operational amplifier $A_1$. The reference potential of the operational amplifier $A_1$ present at the non-inverting input differs from the potential of the reference conductor 30 by a voltage $U_4$. The potential at the inverting input differs from the reference potential of the non-inverting input by the offset voltage $U_{01}$ of the operational amplifier $A_1$.

Between the inverting input of the operational amplifier $A_1$ and the reference conductor 30 there is a parasitic capacitance $C_p$ represented in FIG. 3 by a capacitor symbol.

The switch group 32 includes four switches $S_3$, $S_4$, $S_5$, $S_6$. When the switch $S_3$ is closed it connects the electrode 26 of the measuring capacitor 21 to the inverting input of the operational amplifier $A_1$ and when the switch $S_4$ is closed it connects the electrode 26 of the measuring capacitor 21 to the reference potential at the noninverting input of the operational amplifier $A_1$. When the switch $S_5$ is closed it connects the electrode 28 of the reference capacitor 22 to the inverting input of the operational amplifier $A_1$ and when the switch $S_6$ is closed it applies the electrode 28 of the reference capacitor 22 to the reference potential at the noninverting input of the operational amplifier $A_1$.

The switch group 33 contains two switches $S_7$ and $S_8$. When the switch $S_7$ is closed it connects the noninverting input of the operational amplifier $A_1$ to the tap 38 of the voltage divider 34 so that the voltage $U_4$ present at the noninverting input of the operational amplifier $A_1$ is formed by the voltage $U_2$. When the switch $S_8$ is closed it connects the noninverting input of the operational amplifier $A_1$ to the tap 39 of the voltage divider so that the voltage $U_4$ present at the noninverting input of the operational amplifier $A_1$ is formed by the voltage $U_3$.

The buffer 40 is followed by an integrator 42. The integrator 42 includes an operational amplifier $A_2$, an integration capacitor 43 of capacitance $C_1$ lying in the feedback circuit of the operational amplifier $A_2$ and a switch $S_9$. When the switch $S_9$ is closed, it connects the inverting input of the operational amplifier $A_2$ to the storage capacitor 41 in the buffer 40. The noninverting input of the operational amplifier $A_2$ is applied to ground.

The potential at the inverting input differs from the ground potential of the noninverting input by the offset voltage $U_{02}$ of the operational amplifier $A_2$. Between the output of the operational amplifier $A_2$ and the reference conductor 30 the output voltage $U_{A2}$ appears.

A comparator 45 following the integrator 42 includes an operational amplifier $A_3$ which is connected in known manner as threshold value comparator in that its feedback circuit is open. The inverting input of the operational amplifier $A_3$ is connected to the output of the operational amplifier $A_2$ in the integrator 42 and a threshold voltage $U_S$ is applied to the noninverting input of the operational amplifier $A_3$ with respect to the reference conductor 30. The offset voltage $U_{03}$ is present between the two inputs of the operational amplifier $A_3$. In accordance with the known function of such a threshold value comparator the output voltage $U_{A3}$ of the operational amplifier $A_3$ has a low value when the voltage $U_{A2}$ lies above the threshold voltage $U_S$ and it assumes a high value when the voltage $U_{A2}$ drops below the threshold voltage $U_S$.

The switches $S_1 \ldots S_9$ are actuated by a control circuit 46 comprising a counter 461, a decoder 462; a D-flip-flop 463 and an AND gate 464. The counter 461 of the control circuit 46 is fed by a clock signal generated by a clock generator 47 which also feeds the decoder 462 for synchronizing purposes.

Figure 4:
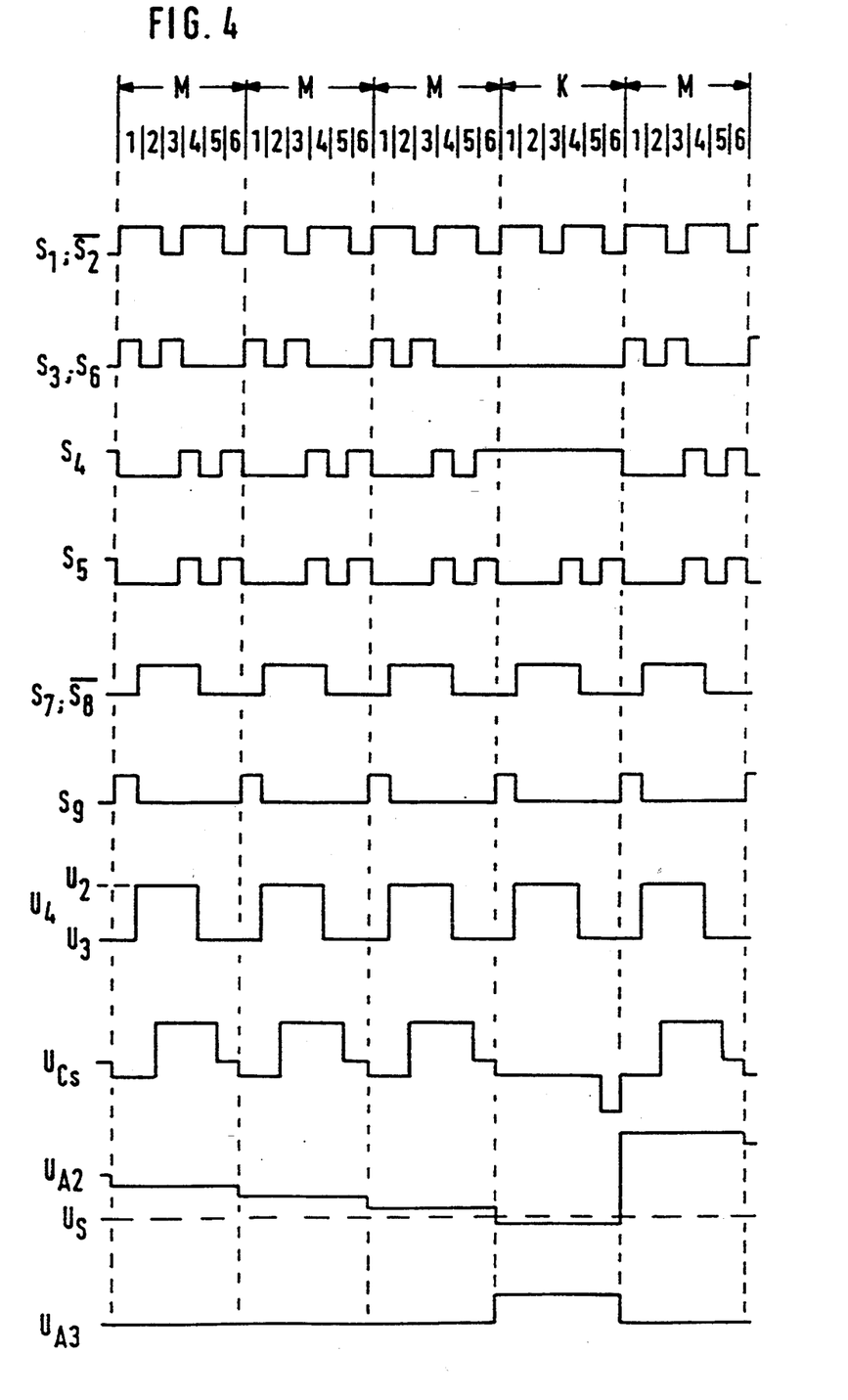
FIG. 4 shows time diagrams of signals occuring in the signal processing circuit of FIG. 3 during its operation.

For simplification, the control signals are denoted by the same reference numerals $S_1 \ldots S_9$ as the switches controlled by them. The time profile of the control signals is shown in the diagrams of FIG. 4. Each switch $S_1 \ldots S_9$ is open when the signal controlling it has the low signal level and is closed when the signal controlling it has the high signal level.

The switches $S_1 \ldots S_9$ are represented symbolically as mechanical switch contacts but in reality of course they are highspeed electronic switches, for example field-effect transistors, in particular insulated gate field-effect transistors.

In the embodiment of FIG. 3 the counter 461 counts to 6 for generating six phases 1 . . . 6 being explained in more detail below with respect to FIG. 4. It is to be noted that any other number of these phases and, therefore, of counting capacity of counter 47 is possible. Each count output 1 . . . 6 delivers a signal to inputs 1 . . . 6 of the decoder 462.

The D-input of the D-flip-flop 463 is connected to the output of the operational amplifier $A_3$ in the comparator 45. The clock input of the D-flip-flop 463 is connected to the count output 1 of counter 461.

The Q-output of the D-flip-flop 463 feeds a signal M—being identical to a signal K—to a further input of the decoder 462 of the control circuit 46. The Q-output of the D-flip-flop 463 is further connected to the first input of AND gate 464. The signal M has its high level when a measuring cycle M is present and the signal K has its high level when a compensation cycle K is present. Therefore, signal K is invers to signal M. The Q-output of the D-flip-flop 463 is connected to a compensation cycle counter 49. The second input of AND gate 464 is connected to the count output 2 of the counter 461 and its output is connected the input of a measuring cycle counter 48.

The embodiment of FIG. 3 operates on the principle of charge balancing. In consecutive cycles controlled by the switches $S_1 \ldots S_8$ charge packets are applied to the capacitors 21, 22 of sensor 20, said packets depending on the voltages $U_2$, $U_3$ and on the capacitances $C_x$, $C_{ref}$ of said capacitors.

The maximum magnitude of the charge packets within the circuit for given capacitance values of the sensor 20 is defined by the voltage divider 34. The charge packets are buffered in the storage capacitor 41 and by closing of the switch $S_9$ transferred to the integration capacitor 43 in which they are summated. The voltage $U_{A2}$ corresponds to the voltage at the integration capacitor 43 which in turn depends on the charge integrated on the integration capacitor. The sequence of the circuit is controlled so that for $C_x > C_{ref}$ the voltage $U_{A2}$ becomes progressively smaller. If the voltage $U_{A2}$ drops below the predetermined threshold voltage $U_S$ of the comparator 45 the output voltage $U_{A3}$ of the latter flips to its maximum value, the control circuit 46 thereby being caused to perform a compensation cycle. In the compensation cycle the switches $S_1$ to $S_8$ are controlled in such a manner that on the next closing of the switch $S_9$ a compensation packet is transferred to the integration capacitor 43 which is substantially proportional to the capacitance $C_{ref}$ of the reference capacitor 22 with a sign such that the voltage $U_{A2}$ is again raised above the threshold voltage $U_S$. As a result, charge balancing takes place in the integration capacitor 43 because on a time average the sum of all the integrated charge packets is equal to zero. This equilibrium is always present at the instants in which the voltage $U_{A2}$ drops below the threshold voltage $U_S$ of the comparator 45.

The sequence of the function described generally above will now be explained in detail with the aid of the diagrams of FIG. 4. Apart from the already mentioned time profile of the switch control signals $S_1$ to $S_9$ the diagrams of FIG. 4 also show the time profile of the voltages $U_4$, $U_{A2}$ and $U_{A3}$ and of the voltage $U_{Cs}$ at the storage capacitor 41 in several cycles, one of which is a compensation cycle K. The other cycles, which are not compensation cycles, are referred to as measuring cycles M. Each cycle consists of six phases numbered 1 to 6.

The switches $S_1$ and $S_2$ are controlled by a periodic square-wave signal in antiphase relationship so that the switch $S_1$ is open when the switch $S_2$ is closed and vice-versa. In each cycle the switch $S_1$ is closed during the phases 1-2 and 4-5 and open during the phases 3 and 6. When the switch $S_1$ is closed and the switch $S_2$ is open the capacitors 21 and 22 of the sensor 20 lying in the input circuit of the operational amplifier $A_1$ can be connected by the switches $S_3$ and $S_5$, respectively, to the voltage present at the inverting input of the operational amplifier $A_1$ and correspondingly charged without thereby influencing the charge in the storage capacitor 41. This state is referred to as "conditioning phase".

The switches $S_7$ and $S_8$ are likewise controlled by a periodic square-wave signal in antiphase relationship so that the switch $S_7$ is open when the switch $S_8$ is closed and vice-versa. When the switch $S_7$ is closed and the switch $S_8$ is open the voltage $U_4$ is equal to the voltage $U_2$; when the switch $S_8$ is closed and the switch $S_7$ is open the voltage $U_4$ is equal to the voltage $U_3$. Thereat $U_2 > U_3$. The measuring and compensation charge packets are generated substantially by these abrupt changes in the voltage $U_4$.

The switch $S_6$ is actuated in each case synchronously with the switch $S_3$ and the switch $S_4$ is actuated synchronously with the switch $S_5$, except for the compensation cycles. The purpose of the switches $S_4$ and $S_6$ is to apply the respective inactive signal line 27 or 29 of the sensor 20 to a potential which differs from the potential of the active signal line only by the offset voltage $U_{01}$ of the operational amplifier $A_1$. As a result, the coupling of erroneous charges via the respective inactive sensor capacitor 21 or 22 and the signal line 27 or 29 thereof to the active signal line is avoided. This function is presumed in the following description; the respective positions of the switches $S_4$ and $S_6$ will therefore not be separately mentioned.

Hereinafter the time sequence of the operation of the signal processing circuit will be described first for a measuring cycle M and then for a compensation cycle K.

1. Measuring cycle M
Phase 1:

At the start of phase 1 of each measuring cycle M the charge applied in the preceding cycle is still present on the storage capacitors. The switches $S_1$ and $S_9$ are closed whilst at the same time the switch $S_2$ is opened. As a result the storage capacitor is separated from the output of the operational amplifier $A_1$ and connected to the input of the integrator 42 so that a charge transfer takes place from the storage capacitor 41 to the integration capacitor 43. Furthermore, in phase 1 the switch $S_7$ is open and the switch $S_8$ closed so that the voltage $U_4$ at the noninverting input of the operational amplifier $A_1$ is formed by the voltage $U_3$. After the discharge of the storage capacitor 41 the impressed voltage $$U_{Cs} = U_{02} - U_3 - U_{01} \tag{1}$$

is present at said storage capacitor 41. Thus, on the storage capacitor 41 there is the residual charge $$Q_{Cs(R)} = (U_{02} - U_3 - U_{01}) \cdot C_s \tag{2}$$

The reverse charge amount flows to the integration capacitor 43. In all further phases 2 to 5 of each cycle the switch $S_9$ is open so that in these phases no reverse charging can take place from the storage capacitor 41 to the integration capacitor 43.

Furthermore, in phase 1 the switch $S_3$ is closed so that the measuring capacitor 21 is connected to the inverting input of the operational amplifier $A_1$. Since at the same time the switch $S_1$ is closed and the switch $S_2$ open, the circuit is in the conditioning phase for the measuring capacitor 21. The measuring capacitor 21 is charged with $U_4 = U_3$ to the charge $$Q_{Cx(1)} = (U_{01} + U_3 - U_1) \tag{3}$$

(conditioned) without thereby influencing the charge on the storage capacitor 41.

Phase 2:

In phase 2 the switch $S_3$ is opened whilst the switch $S_5$ remains open so that the two capacitors 21 and 22 of the sensor 20 are separated from the inputs of the operational amplifier $A_1$. At the same time the switch $S_7$ is closed and the switch $S_8$ opened so that the voltage $U_4$ jumps from the value $U_3$ to the value $U_2$. The parasitic capacitance $C_p$ is correspondingly reverse charged. Since the switch $S_1$ is still closed and the switch $S_2$ open, the entire charge necessary for reverse charging the parasitic capacitance $C_p$ is furnished by the output of the operational amplifier $A_1$. The charges on the storage capacitor 41 and on the integration capacitor 43 remain uninfluenced by this reverse charging.

Phase 3:

In phase 3 the switch $S_1$ is open and the switch $S_2$ closed so that the buffer 40 is ready for the transfer of charge to the storage capacitor 41. At the same time the switch $S_3$ is closed again so that the measuring capacitor 21 is connected to the inverting input of the operational amplifier $A_1$ and reverse charged to the charge $$Q_{Cx(3)} = (U_{01} + U_2 - U_1) \tag{4}$$

The reverse charge amount $$dQ_{Cx(3)} = Q_{Cx(3)} - Q_{Cx(1)} = (U_2 - U_3) \cdot C_x \tag{5}$$

flows to the storage capacitor 41.

Phase 4:

Phase 4 is the conditioning phase for the reference capacitor 22 because the switch $S_1$ is closed and the switch $S_2$ is open and at the same time the switch $S_5$ is closed so that the reference capacitor 22 is connected to the inverting input of the operational amplifier $A_1$. Since the switch $S_7$ is still closed and the switch $S_8$ open, the voltage $U_4$ has the value $U_2$. The reference capacitor 22 is thus charged (conditioned) to the charge $$Q_{Cref(4)} = (U_{01} + U_2 - U_1) \cdot C_{ref} \tag{6}$$

without the charge on the storage capacitor 41 being influenced thereby.

Phase 5:

The switch $S_5$ is opened so that the reference capacitor 22 is separated from the inverting input of the operational amplifier $A_1$. The switch $S_7$ is opened and the switch $S_8$ closed so that the voltage $U_4$ jumps from the value $U_2$ to the value $U_3$ and the parasitic capacitance $C_p$ is correspondingly reverse charged. Since the switch $S_1$ is still closed and the switch $S_2$ open, the entire charge necessary for reverse charging the parasitic capacitance $C_p$ is furnished by the output of the operational amplifier $A_1$ without the charges on the storage capacitor 41 and on the integration capacitor 43 being influenced thereby.

Phase 6:

In phase 6 the switch $S_1$ is open and the switch $S_2$ closed so that the buffer 40 is ready for the transfer of charge to the storage capacitor 41. At the same time the switch $S_5$ is again closed so that the reference capacitor 22 is connected to the inverting input of the operational amplifier $A_1$ and is reverse charged to the charge $$Q_{Cref(6)} = (U_{01} + U_3 - U_1) \quad (7)$$

The reverse charge amount $$dQ_{Cref(6)} = Q_{Cref(6)} - Q_{Cref(4)} = -(U_2 - U_3) \cdot C_{ref} \quad (8)$$

flows to the storage capacitor 41.

This completes the measuring cycle M. At the end of the measuring cycle M the storage capacitor 41 contains the resultant charge $$\begin{aligned} Q_{Cs} &= Q_{Cs(R)} + dQ_{Cx(3)} + dQ_{Cref(6)} \\ &= Q_{Cs(R)} + (U_2 - U_3) \cdot (C_x - C_{ref}) \end{aligned} \quad (9)$$

In phase I of the following cycle the storage capacitor 41 is again discharged to the residual charge $Q_{Cs(R)}$ according to the equation (2), the reverse charge amount $$dQ_M = Q_{Cs(R)} - Q_{Cs} = -(U_2 - U_3) \cdot (C_x - C_{ref}) \quad (10)$$

being transferred to the integration capacitor 43. The reverse charge amount $dQ_M$ is referred to as measuring charge packet. With $C_x > C_{ref}$ and $U_2 > U_3$, the measuring charge packet $dQ_M$ is negative so that is causes a negative voltage jump in the voltage $U_{A2}$.

The phases 1 to 6 of each measuring cycle M are cyclically repeated until the voltage $U_{A2}$ drops below the threshold voltage $U_S$ of the comparator 45 and the level of the voltage $U_{A3}$ changes from a low to a high value. The control circuit 46 is thereby caused to perform a compensation cycle K.

2. Compensation cycle K

The sequence for a compensation cycle K is identical to the sequence of the measuring cycles N except for the difference that the switch $S_3$ remains open and the switch $S_4$ remains closed all the time. As a result, during the entire compensation cycle K no charge flows from the measuring capacitor 22 into the storage capacitor 41. Accordingly, instead of equation (5) we have $$dQ_{Cx(3)} = 0 \quad (11)$$

If equations (11) and (8) are inserted into equation (9), this gives as resultant charge in the storage capacitor 41 at the end of the compensation cycle K:

$$\begin{aligned} Q_{Cs} &= Q_{Cs(R)} + dQ_{Cx(3)} + dQ_{Cref(6)} \\ &= Q_{Cs(R)} - (U_2 - U_3) \cdot C_{ref} \end{aligned} \quad (12)$$

In phase 1 of the following cycle the storage capacitor 41 is again discharged to the residual charge $Q_{Cs(R)}$ according to equation (2), the reverse charge amount $$dQ_K = Q_{Cs(R)} - Q_{Cs} = +(U_2 - U_3) \cdot C_{ref} \quad (13)$$

being transferred to the integration capacitor 43. The reverse charge amount $dQ_K$ is referred to as compensation charge packet. With $U_2 > U_3$ the compensation charge packet $dQ_K$ is positive so that it causes a positive voltage jump in the voltage $U_{A2}$. The positive voltage jump results in the voltage $U_{A2}$ again being raised above the threshold voltage $U_S$ so that the level of the voltage $U_{A3}$ again goes from the high value to the low value. This causes the control circuit 46 to perform measuring cycles N again, the compensation cycle K thereby being completed.

Charge balance

Equations (10) and (13) describe the measuring charge packets $dQ_M$ and the compensation charge packets $dQ_K$ respectively. The measuring method operates by the process of charge balancing, i.e. a charge equilibrium arises in the integration capacitor 43. The charge equilibrium in a time average is always present at the instants when the voltage drops below the threshold voltage $U_S$. If the charge state of the integration capacitor 43 is considered, then a predetermined number of measuring charge packets $dQ_M$ is integrated until the voltage drops below the threshold voltage $U_S$; the integrated measuring charge packets are then compensated by a compensation charge packet $dQ_K$ and the process starts again.

On each execution of a measuring cycle M the control circuit 46 supplies a pulse to the counting input of the measuring cycle counter 48 and on each execution of a compensation cycle a pulse to the counting input of the compensation cycle counter 49. If a time interval in which the measuring cycle counter 48 has counted a total of n measuring cycles H and the compensation cycle counter 49 a total of k compensation cycles K is considered, due to the charge balancing the following must be true:

$$n \cdot dQ_M + k \cdot dQ_K = 0 \quad (14)$$

$$-n \cdot (U_2 - U_3) \cdot (C_x - C_{ref}) + k \cdot (U_2 - U_3) \cdot C_{ref} = 0 \quad (15)$$

Thus, the desired capacitance ratio is obtained directly from the ratio of the pulses counted in the counters 48 and 49 in the time interval considered:

$$\frac{k}{n} = \frac{C_x - C_{ref}}{C_{ref}} \quad (16)$$

The same result is obtained if the ratio of the repetition frequencies of the pulse trains supplied to the two counters 48 and 49 is formed.

The capacitance values of the capacitors 41 and 43, the offset voltages of the operational amplifiers, the reference potential $U_1$ of the sensor 20, the operating voltage of the circuit and the frequency with which the control circuit 46 is clocked, do not enter into the measurement result, as is apparent from equation (16).

The value of the voltage $U_1$ is limited only by the working range of the circuit.

In FIG. 3 the shields of the signal lines 27 and 29 are connected to the line leading from the switch group 33 to the noninverting input of the operational amplifier $A_1$. The potential of the shields is thereby made to follow up the changing reference potential of the input operational amplifier and thus always substantially corresponds to the potential of the shielded conductors.

This step also contributes to avoiding error charges being coupled onto the active signal line.

The internal logic of the decoder 462 of FIG. 3 can be readily derived by using following table 1. This table shows for a measuring cycle (left half) and for a compensation cycle (right half) digital signals (zeros ore ones) corresponding to the control signals M, $S_1 \ldots S_9$ during the six phases 1 ... 6. Assuming a positive logic a one belongs to a high level and a zero belongs to a low level of the above control signals as shown in FIG. 4.

TABLE 1

| phase no. | 1 | 2 | 3 | 4 | 5 | 6 | 1 | 2 | 3 | 4 | 5 | 6 |
|---|---|---|---|---|---|---|---|---|---|---|---|---|
| M, $\overline{K}$ | 1 | 1 | 1 | 1 | 1 | 1 | 0 | 0 | 0 | 0 | 0 | 0 |
| $S_1$, $S_2$ | 1 | 1 | 0 | 1 | 1 | 0 | 1 | 1 | 0 | 1 | 1 | 0 |
| $S_3$, $S_6$ | 1 | 0 | 1 | 0 | 0 | 0 | 0 | 0 | 0 | 0 | 0 | 0 |
| $S_4$ | 0 | 0 | 0 | 1 | 0 | 1 | 1 | 1 | 1 | 1 | 1 | 1 |
| $S_5$ | 0 | 0 | 0 | 1 | 0 | 1 | 0 | 0 | 0 | 1 | 0 | 1 |
| $S_7$, $\overline{S_8}$ | 0 | 1 | 1 | 1 | 0 | 0 | 0 | 1 | 1 | 1 | 0 | 0 |
| $S_9$ | 1 | 0 | 0 | 0 | 0 | 1 | 0 | 0 | 0 | 0 | 0 | 0 |

Figure 5:
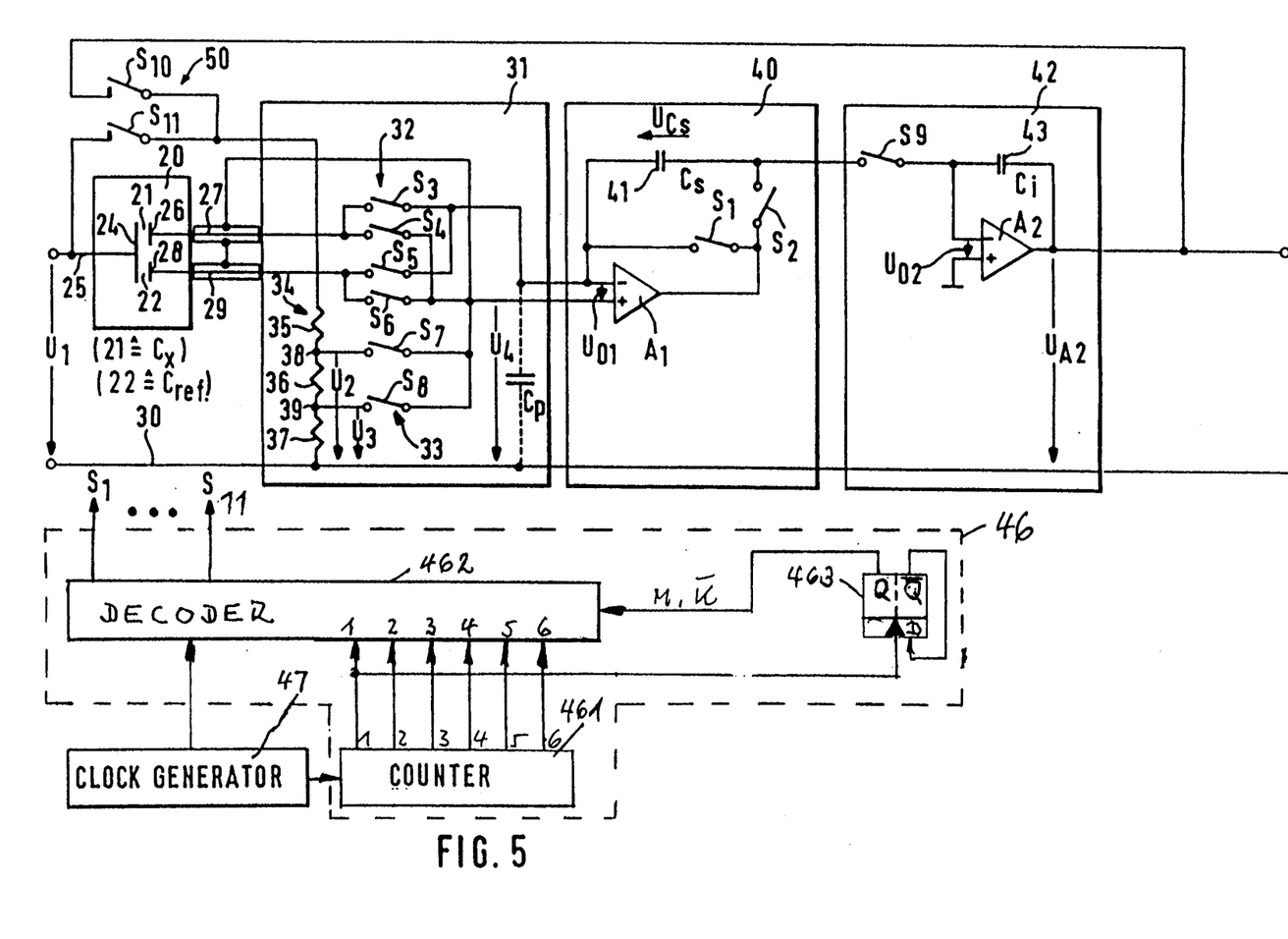
FIG. 5 shows the circuit diagram of a second embodiment of a signal processing circuit working with quantized charge transport by means of switch-capacitor structures and charge balancing and furnishing an analog output signal.

FIG. 5 shows a second embodiment of the signal processing circuit 2 according to FIG. 1 for the signal processing of the sensor signal furnished by the capacitive sensor 20. The signal processing circuit according to FIG. 5 differs from that of FIG. 3 by the following features: The comparator 45, the counters 48, 49 and the AND gate 464 are not present, but the other circuit parts of FIG. 3 bearing the same reference numerals are present. Further differences consist in the presence of a third switch group 50 consisting of the switches $S_{10}$, $S_{11}$ and in a changes concerning the connections of the D-flip-flop 463.

The terminal of the voltage divider 34 not connected to the reference conductor 30 is connected either via the switch $S_{10}$ to the output of the integrator 42 or via the switch $S_{11}$ to the connection conductor 25. The switches $S_{11}$, $S_{12}$ the control signals of which are also generated by the control circuit 46 are never closed at the same time. Furthermore, they are open—like the switches $S_1 \ldots S_9$—when the control signal has its low level and they are closed when the control signal has its high level. Again the control signals of the switches $S_{11}$, $S_{12}$ are denoted by the same reference numerals as the switches themselves. They are realized by means of fast electronic switches as already mentioned above.

The change concerning the connections of the D-flip-flop 463 deviating from that of FIG. 3 consists in that the Q-output is connected to the D-input. Therefore, it works as a simple toggle stage or binary divider stage going in its other state on each pulse fed to the clock input.

TABLE 2

| phase no. | 1 | 2 | 3 | 4 | 5 | 6 | 1 | 2 | 3 | 4 | 5 | 6 |
|---|---|---|---|---|---|---|---|---|---|---|---|---|
| M, $\overline{K}$ | 1 | 1 | 1 | 1 | 1 | 1 | 0 | 0 | 0 | 0 | 0 | 0 |
| $S_1$, $S_2$ | 1 | 1 | 0 | 1 | 1 | 0 | 1 | 1 | 0 | 1 | 1 | 0 |
| $S_3$, $S_6$ | 1 | 0 | 1 | 0 | 0 | 0 | 0 | 0 | 0 | 0 | 0 | 0 |
| $S_4$ | 0 | 0 | 0 | 1 | 0 | 1 | 1 | 1 | 1 | 1 | 1 | 1 |
| $S_5$ | 0 | 0 | 0 | 1 | 0 | 1 | 0 | 0 | 0 | 1 | 0 | 1 |
| $S_7$, $\overline{S_8}$ | 0 | 1 | 1 | 1 | 0 | 0 | 0 | 1 | 1 | 1 | 0 | 0 |
| $S_9$ | 1 | 0 | 0 | 0 | 0 | 1 | 0 | 0 | 0 | 0 | 0 | 0 |
| $S_{10}$, $\overline{S_{11}}$ | 0 | 0 | 0 | 0 | 0 | 0 | 0 | 1 | 1 | 1 | 1 | 1 |

Figure 6:
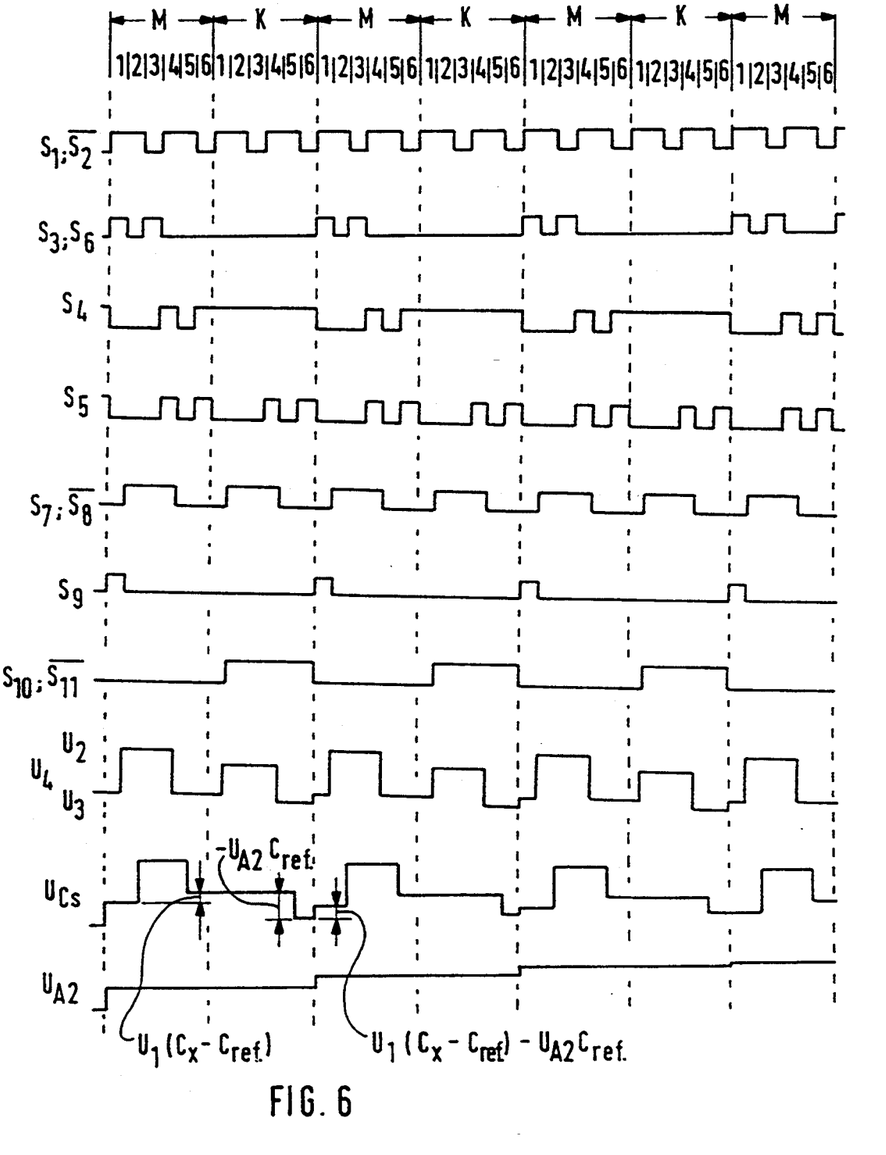
FIG. 6 shows time diagrams of signals occuring in the signal processing circuit of FIG. 5 during its operation.

The internal logic of the decoder 462 of FIG. 5 can be readily derived by using the above shown table 2 which corresponds to and is made under the same conditions as table 1 but with respect to the signals as shown in FIG. 6. Therefore and again, table 2 shows for a measuring cycle (left half) and for a compensation cycle (right half) digital signals (zeros ore ones) corresponding to the control signals M, $S_1 \ldots S_{11}$ during the six phases 1 ... 6 of FIG. 6. Assuming a positive logic a one belongs to a high level and a zero belongs to a low level of the above control signals.

The circuit of FIG. 5 operates like that of FIG. 3 according to the principle of charge balance. Again controlled by the switches $S_1 \ldots S_8$ charge packets are transferred to the capacitors 21, 22 of the sensor 20 during consecuting cycles. The charge packets are depending on the voltages $U_1$, $U_3$ and on the capacitances $C_x$, $C_{ref}$ of these capacitors. The maximum value of the charge packets of a given circuit and given capacitances of the sensor 20 is defined by the voltage divider 34. The charge packets are buffered in the storage capacitor 41 and by closing of the switch $S_9$ transferred to the integration capacitor 43 in which they are summated. The voltage $U_{A2}$ corresponds to the voltage at the integration capacitor 43 which in turn depends on the charge integrated thereon.

The sequence of the common function of FIG. 5 just described will now be explained only so far as it deviates from the function of FIG. 3 and its diagrams of FIG. 4. Apart from the time profile of the switch control signals $S_1 \ldots S_{11}$ the FIG. 6 shows also the time profile of the voltages $U_4$, $U_{A2}$ and of the voltage $U_{Cs}$ at the storage capacitor 41 in several cycles, each second of which is a compensation cycle K. The other cycles, which are not compensation cycles, are again referred to measuring cycles M. The alternate sequence of the cycle types of FIG. 6 is only an example; an optional number of compensation cycles can rather follow to an optional number of measuring cycles. Each cycle consists of six phases numbered again by 1 to 6.

Controlling of the switches $S_1 \ldots S_8$ and the functions thereby generated are equal to those of the switches $S_1 \ldots S_8$ of FIG. 3. In contrary to FIG. 3 the switch $S_9$ is open during each compensation cycle. Therefore, charge is transferred to the integration capacitor 43 only during phase 1 of the measuring cycles M.

Furthermore, switch $S_{11}$ is closed during the measuring cycles M as well as during phase 1 of the compensation cycles. Therefore, at these moments the terminal of the voltage divider 34 not facing the reference conductor 30 lies at the connection conductor 25 and at the fixed voltage $U_1$.

In this phase the following equation holds:

$$U_2 - U_3 = U_1 \cdot R_{36}/(R_{35} + R_{36} + R_{37}) = U_1 \cdot v_R \qquad (17)$$

In the phases 2 to 6 of the compensation cycles K switch $S_{11}$ is open and switch $S_{10}$ is closed. Therefore, the voltage divider 34 is connected to the output of the integrator 42 and the analog output voltage $U_{A2}$ of the operational amplifier $A_2$ lies at the voltage divider 34.

In these phases the following equation holds:

$$U_2 - U_3 = U_{A2} \cdot R_{36}/(R_{35} + R_{36} + R_{37}) = U_{A2} \cdot v_R \qquad (18)$$

The reference numerals $R_{35}$, $R_{36}$, $R_{37}$ of equations (17), (18) designate the resistances of the resistors 35, 36, 37 of the voltage divider 34.

The equations (15), (16) holding for optional numbers n, k of cycles change, therefore, to:

$$-n \cdot U_1 \cdot v_R \cdot (C_x - C_{ref}) + k \cdot U_{A2} \cdot v_R \cdot C_{ref} = 0 \qquad (19)$$

$$(k/n) \cdot (U_{A2}/U_1) = (C_x - C_{ref})/C_{ref} \qquad (20)$$

To equations (20) and with respect to FIG. 5 there is to be noted that FIG. 5 is shown and discussed above under the condition k=n=1. In cases when k≠1, n≠1 D-flip-flop 463 of FIG. 5 is to be superseeded by an additional counter with a count capacity of n+k. The count outputs 1 to n are decoded to deliver the signal M and the count outputs are decoded to deliver the signal K.

When the signal processing circuit according to the invention is to be realized in the form of a so-called Application Specific Integrated Circuit chip (=ASIC), the applicant being a.o. a pressure sensor manufacturer but not a chip manufacturer will order the chip by a chip manufacturer and will deliver him the above explained circuit and the time diagram or the circuit and tables 1 and/or 2. With this information the chip manufacturer is able to layout the chip, i.e. to prepare the mask work for each manufacturing process step of the chip.

I claim:

1. Arrangement for processing sensor signals furnished by a capacitive sensor
    which includes a measuring capacitor having a measuring capacitance influenceable by a physical measured quantity to be determined and at least one reference capacitor having a reference capacitance which is substantially unaffected by said physical measured quantity and
    which includes an operational amplifier,
    which furnishes a measuring effect dependent on said measuring capacitance and said reference capacitance, comprising a signal processing circuit
    which operates by the principle of quantized charge transport by means of switch-capacitor structures and charge balancing at least in time average and
    which receives said sensor signals representing said measuring effect and furnishes an output signal corresponding to said measuring effect,
    wherein first electrodes of said measuring capacitor and said reference capacitor of said sensor lie at a fixed potential and second electrodes of said measuring capacitor and said reference capacitor for performing said charge transport are selectively coupled through a selected portion of the switch-capacitor structures to a first input of the operational amplifier, a second input of which lies at a reference potential, and
    wherein a reverse charging of said measuring capacitor and said reference capacitor of said sensor necessary for forming transported charge packets is effected by switching over said reference potential of said second input of said operational amplifier between different voltage levels.

2. Arrangement according to claim 1, wherein one of said second electrodes of said measuring capacitor and said reference capacitor not connected to one of said inputs of said operational amplifier for performing said charge transport is switched to said reference potential of said operational amplifier.

3. Arrangement according to claim 1, wherein to eliminate a parasitic capacitance in a connection leading to said first input of said operational amplifier, said measuring capacitor and said reference capacitor of said sensor are separated from said operational amplifier during the switching over of said reference potential.

4. Arrangement according to claim 1, wherein between said sensor and said operational amplifier a function block is inserted which contains a first group of periodically actuated switches which selectively connect said second electrodes of said measuring capacitor and said reference capacitor to said first input of said operational amplifier or to said reference potential of said operational amplifier, and said function block includes a second group of periodically actuated switches which alternately apply a first or a second voltage to said second input of said operational amplifier for switching said reference potential over.

5. Arrangement according to claim 1, wherein signal lines leading from said second electrodes of said measuring capacitor and said reference capacitor to said first input of said operational amplifier are shielded and a potential of a shield of said signal lines is caused to follow up a reference of said operational amplifier.

6. Arrangement according to claim 4, wherein said function block contains a voltage divider at which said voltages serving for generating measuring charge packets are tapped and which is adjusted for matching said measuring charge packets to a working range of said single processing circuit.

7. Arrangement according to claim 6 delivering an analog output signal, wherein in order to generate compensation charge packets, a terminal of said voltage divider not connected to a reference conductor is coupled via a first switch of a third group of switches to an output of an integrator, and in order to generate said measuring charge packets said terminal of said voltage divider is coupled via a second switch of said third group of switches to a fixed potential.

8. An apparatus for processing sensor signals furnished by a capacitive sensor which includes a measuring capacitor having a first electrode and a second electrode for providing a measuring capacitance influenceable by a physical measured quantity to be determined and at least one reference capacitor having a first electrode and a second electrode for providing a reference capacitance which is substantially unaffected by said physical measured quantity and which furnishes a measuring effect dependent on said measuring capacitance and said reference capacitance, the apparatus comprising a signal processing circuit which operates by the principle of quantized charge transport by means of switch-capacitor structures and charge balancing at least in time average and which receives said sensor signals representing said measuring effect and furnishes an output signal corresponding to said measuring effect, the first electrodes of said measuring capacitor and said reference capacitor of said sensor being coupled to a fixed potential, and wherein the second electrodes of said measuring capacitor and said reference capacitor for performing said charge transport are selectively coupled through a selected portion of the switch-capacitor structures to a first input of an operational amplifier in the signal processing circuit, a second input of the operational amplifier being coupled to the reference potential, and wherein a reverse charging of said measuring capacitor and said reference capacitor of said sensor necessary for forming transported charge packets is effected by selectively switching over said reference potential of said second input of said operational amplifier between different voltage levels.

9. The apparatus of claim 8, wherein one of said second electrodes of said measuring capacitor and said reference capacitor not connected to one of the first and second inputs of said operational amplifier for performing said charge transport is switched to said reference potential of said operational amplifier.

10. The apparatus of claim 8, wherein to eliminate a parasitic capacitance in a connection leading to said first input of said operational amplifier, said measuring capacitor and said reference capacitor of said sensor are separated from said operational amplifier during the switching over of said reference potential.

11. The apparatus of claim 8, wherein signal lines leading from said second electrodes of said measuring capacitor and said reference capacitor to said first input of said operational amplifier are shielded and a potential of a shield of said single lines is caused to follow up a reference of said operational amplifier.

12. The apparatus of claim 8, wherein a function block is coupled between said sensor and said operational amplifier, the function block including a first group of periodically actuated switches which selectively connect said second electrodes of said measuring capacitor and said reference capacitor to said first input of said operational amplifier or to said reference potential of said operational amplifier, and said function block including a second group of periodically actuated switches which alternately apply a first or a second voltage to said second input of said operational amplifier for switching said reference potential over.

13. The apparatus of claim 12, wherein said function block contains a voltage divider at which said voltages serving for generating measuring charge packets are tapped and which is adjusted for matching said measuring charge packets to a working range of said single processing circuit.

14. The apparatus of claim 13, delivering an analog output signal, wherein in order to generate compensation charge packets, a terminal of said voltage divider not connected to a reference conductor is coupled via a first switch of a third group of switches to an output of an integrator, and in order to generate said measuring charge packets said terminal of said voltage divider is coupled via a second switch of said third group of switches to a fixed potential.

* * * * *